US006187823B1

(12) United States Patent
Haddon et al.

(10) Patent No.: US 6,187,823 B1
(45) Date of Patent: Feb. 13, 2001

(54) SOLUBILIZING SINGLE-WALLED CARBON NANOTUBES BY DIRECT REACTION WITH AMINES AND ALKYLARYL AMINES

(75) Inventors: Robert C. Haddon; Jian Chen, both of Lexington, KY (US)

(73) Assignee: University of Kentucky Research Foundation, Lexington, KY (US)

( * ) Notice: Under 35 U.S.C. 154(b), the term of this patent shall be extended for 0 days.

(21) Appl. No.: 09/409,296

(22) Filed: Sep. 29, 1999

Related U.S. Application Data (60) Provisional application No. 60/102,909, filed on Oct. 2, 1998, and provisional application No. 60/102,787, filed on Oct. 2, 1998.

(51) Int. Cl.$^7$ ................................. B01F 3/12; B01F 3/20; C09C 1/56
(52) U.S. Cl. .............................. 516/32; 117/921; 423/460
(58) Field of Search ................. 516/32; 252/182.28; 423/460; 117/921

(56) References Cited

U.S. PATENT DOCUMENTS

| | | | |
|---|---|---|---|
| 3,301,790 | * 1/1967 | Fitch et al. | 516/32 X |
| 3,479,299 | * 11/1969 | Rivin et al. | 423/460 X |
| 4,073,869 | * 2/1978 | Kalnin | 423/460 X |
| 5,346,683 | * 9/1994 | Green et al. | 423/460 X |
| 5,560,898 | 10/1996 | Uchida et al. | 423/461 |
| 5,695,734 | 12/1997 | Ikazaki et al. | 423/461 |
| 5,698,175 | * 12/1997 | Hiura et al. | 423/460 X |
| 5,716,708 | 2/1998 | Lagow | 428/408 |
| 6,036,774 | * 3/2000 | Lieber et al. | 117/921 X |

OTHER PUBLICATIONS

Thomas W. Ebbesen, "Cones and Tubes: Geometry in the Chemistry of Carbon," Acc. Chem. Res., vol. 31 (No. 9), pp. 558–566, (Jul. 17, 1998).

Y. Chen and R.C. Haddon, "Chemical Attachment of Organic Funcitonal Groups to Single–Walled Carbon Nanotube Material," Materials Research Society, vol. 13 (No. 9), pp. 2423–2431, (Sep. 9, 1998).

Boris I. Yakobson and Richard E. Smalley, "Fulleren Nanotubes: C 1,000,000 and Beyond," American Scientist, pp. 324–337, Jul.–Aug. 1997.

C. Journet et al., "Large–Scale Production Of Single–Walled Carbon Nanotubes By The Electric–Arc Technique," Nature, vol. 388 (No. 21), pp. 56–58, (Aug. 21, 1997).

A.G. Rinzler et al., "Large–Scale purification of Single–Wall Carbon Nantotubes: Process, Product, and Characterization," Appl. Phys., pp. 29–37, (Dec. 16, 1998).

Erik Duijardin et al., "Purification of Single–Shell Nanotubes," Communications, Wiley–VCH, vol. 10 (No. 8), pp. 611–613, (Dec. 16, 1998).

Jian Chen et al., "Solution Properties of Single–Walled Carbon Nanotubes," Reports, Science, pp. 95–98, (Oct. 2, 1998).

* cited by examiner

Primary Examiner—Richard D. Lovering
(74) Attorney, Agent, or Firm—King & Schickli PLLC (57) ABSTRACT

Naked single-walled nanotube carbon metals and semiconductors are dissolved in organic solutions by direct functionalization with amines or alkylaryl amines having an uninterrupted carbon chain of at least 5 and more preferably 9 carbon atoms in length.

15 Claims, 2 Drawing Sheets

Fig. 2

SOLUBILIZING SINGLE-WALLED CARBON NANOTUBES BY DIRECT REACTION WITH AMINES AND ALKYLARYL AMINES

This application claims the benefit of U.S. Provisional Application No. 60/102,909 filed Oct. 2, 1998 and U.S. Provisional Application No. 60/102,787 filed Oct. 2, 1998.

TECHNICAL FIELD

The present invention relates to the dissolution of single-walled carbon nanotubes in solutions and more particularly, to a method of dissolving naked single walled nanotube carbon metals and semiconductors in organic solutions.

BACKGROUND OF THE INVENTION

All previous work on carbon nanotubes (both single-walled and multi-walled), has been carried out on the usual intractable, insoluble form of this material [Yakobson, B. I.; Smalley, R. E., Fullerene Nanotubes: C1,000.000 and Beyond. American Scientist 1997, 85, 324-337.] This form of the material is not amenable to many of the processing steps that are necessary if the single-walled carbon nanotubes (SWNTs) are to reach their full potential—particularly in applications that require these materials in the form of polymers, copolymers, composites, ceramics and moldable forms.

While present forms of the SWNTs can be heterogeneously dispersed in various media, the interactions between the SWNTs and host and between the SWNTs themselves are simply physical, and without the formation of chemical bonds. Thus, the advantageous properties of the SWNTs are unlikely to be realized on a macroscopic level. What is needed is a method to prepare well-dispersed forms of SWNTs perhaps by inducing them to exfoliate from the bundles and dissolve in organic solvents. Although long believed to be impossible, [Ebbesen, T. W., Cones and Tubes: Geometry in the Chemistry of Carbon. Acc. Chem. Res. 1998, 31, 558–566] we now teach such a procedure for the dissolution of SWNTs [Chen, J.; Hamon, M. A.; Hu, H.; Chen, Y.; Rao, A. M.; Eklund, P. C.; Haddon, R. C., Solution Properties of Single-Walled Carbon Nanotubes. Science 1998, 282, 95–98; Hamon, M. A.; Chen, J.; Hu, H.; Chen, Y.; Rao, A. M.; Eklund, P. C.; Haddon, R. C., Dissolution of Single-Walled Carbon Nanotubes. Adv. Mater. 1999, 11, 834–840].

SUMMARY OF THE INVENTION

Accordingly, it is a primary object of the present invention to overcome the above-described limitations and disadvantages of the prior art by providing (1) a method of solubilizing single-walled carbon nanotubes; and (2) solutions of single-walled carbon nanotubes dissolved in an organic solvent. Such solutions are anticipated to be useful in determining the functionalization chemistry of the open ends, the exterior walls or convex face and the interior cavity or concave face of single-walled carbon nanotubes and processing useful nanotube based polymer, copolymer and composite products and devices for a multitude of applications in various industries including aerospace, battery, fuel cell and electromagnetic radiation shielding.

Advantageously, as a result of the present invention, functionalization chemistry of the SWNTs can be determined through the study of both the ionic and covalent solution phase chemistry with concomitant modulation of the single wall nanotube band structure.

Additional objects, advantages, and other novel features of the invention will be set forth in part in the description that follows and in part will become apparent to those skilled in the art upon examination of the following or may be learned with the practice of the invention. The objects and advantages of the invention may be realized and attained by means of the instrumentalities and combinations particularly pointed out in the appended claims.

To achieve the foregoing and other objects, and in accordance with the purposes of the present invention as described herein, a novel and improved method of dissolving single-walled carbon nanotubes and semiconductors in common organic solutions is provided. The method comprises terminating purified single-walled carbon nanotubes with carboxylic acid groups, then reacting the carboxylic acid groups with an amine or an alkylaryl amine having a formula (1) $RNH_2$ or (2) $R_1R_2NH_1$ wherein R, $R_1$ and $R_2=CH_3(CH_2)_n$ where n=9–50 or R, $R_1$ and $R_2=(C_6H_4)(CH_2)_nCH_3$ where n=5–50 and then dissolving the reacted single-walled carbon nanotubes in the organic solvent.

More specifically describing the method, the compound of formula (1) $RNH_2$ is a compound selected from a group including nonylamine, dodecylamine, octadecylamine, pentacosylamine, tetracontylamine, pentacontylamine and any mixtures thereof and the alkylaryl amine compound of formula (2) is a compound selected from a group consisting of 4-pentylaniline, 4-dodecylaniline, 4-tetradecylaniline, 4-pentacosylaniline, 4-tetracontylaniline, 4-pentacontylaniline and any mixtures thereof. The reacting step may be further described as including the mixing of the single-walled carbon nanotubes with the amine or allkylaryl amine in an appropriate solvent (eg. toluene, chlorobenzene, dichlorobenzene, dimethylformamide, hexmethylphosphoramide, dimethylsulfoxide) or without solvent and the heating of the resulting mixture to a temperature between 50°–200° C. and more preferably 90°–100° C. Preferably, the heating is maintained for a least 96 hours during which the reaction is completed.

In accordance with yet another aspect of the present invention, a novel solution is provided comprising single-walled carbon nanotubes dissolved in an organic solvent. More specifically, that organic solvent is selected from a group including, for example, tetrahydrofuran, chloroform, benzene, toluene, chlorobenzene, 1,2-dichlorobenzene, dichlorocarbene, ether and mixtures thereof. The single-walled carbon nanotubes dissolved in the organic solvent are a zwitterion having a length between 1–1000 nm and a diameter between 0.5–100 nm and an alkyl chain of 5 and more preferably 9 or more carbon atoms in length.

Advantageously, such a solution not only allows the study of the functionalization chemistry of the open ends, the exterior walls or convex face and the interior cavity or concave face of the nanotubes, but also processing of the nanotubes into useful products for various applications including as intermediates in the preparation of polymer, copolymer and composite materials.

Still other objects of the present invention will become apparent to those skilled in this art from the following description wherein there is shown and described a preferred embodiment of this invention, simply by way of illustration of one of the modes and alternate embodiments best suited to carry out the invention. As it will be realized, the invention is capable of still other and different embodiments, and its several details are capable of modifications in various, obvious aspects all without departing from the invention. Accordingly, the drawings and descriptions will be regarded as illustrative in nature and not as restrictive.

BRIEF DESCRIPTION OF THE DRAWINGS

The accompanying drawing incorporated in and forming a part of the specification, illustrates several aspects of the present invention, and together with the description serve to explain the principles of the invention. In the drawing.

Reference will now be made in detail to the present preferred embodiment of the invention, an example of which is illustrated in the accompanying drawings.

DETAILED DESCRIPTION OF THE INVENTION

In the novel method of the present invention, we begin with raw, as prepared, SWNT soot (AP-SWNTs) which may be obtained from CarboLex, Inc. of Lexington, Kentucky. This is prepared by use of an electric arc technique similar to that described by Journet, C.; Maser, W. K.; Bernier, P.; Loiseau, A.; Lamy de la Chappelle, M.; Lefrant, S.; Deniard, P.; Lee, R. and Fischer, J. E., in Large Scale Production of Single-Walled Carbon Nanotubes by the Electric-Arc Technique. Nature 1997, 388, 756–758. The estimated purity of this material is 40–60% SWNT by volume. Batches of 10 grams may be prepared in a single run and there is considerable scope for further increase in scale. Thus it is possible to contemplate the very large-scale production of this material in the future. We describe herein routes to soluble SWNTs (s-SWNTs), starting from AP-SWNTs.

Figure 1:
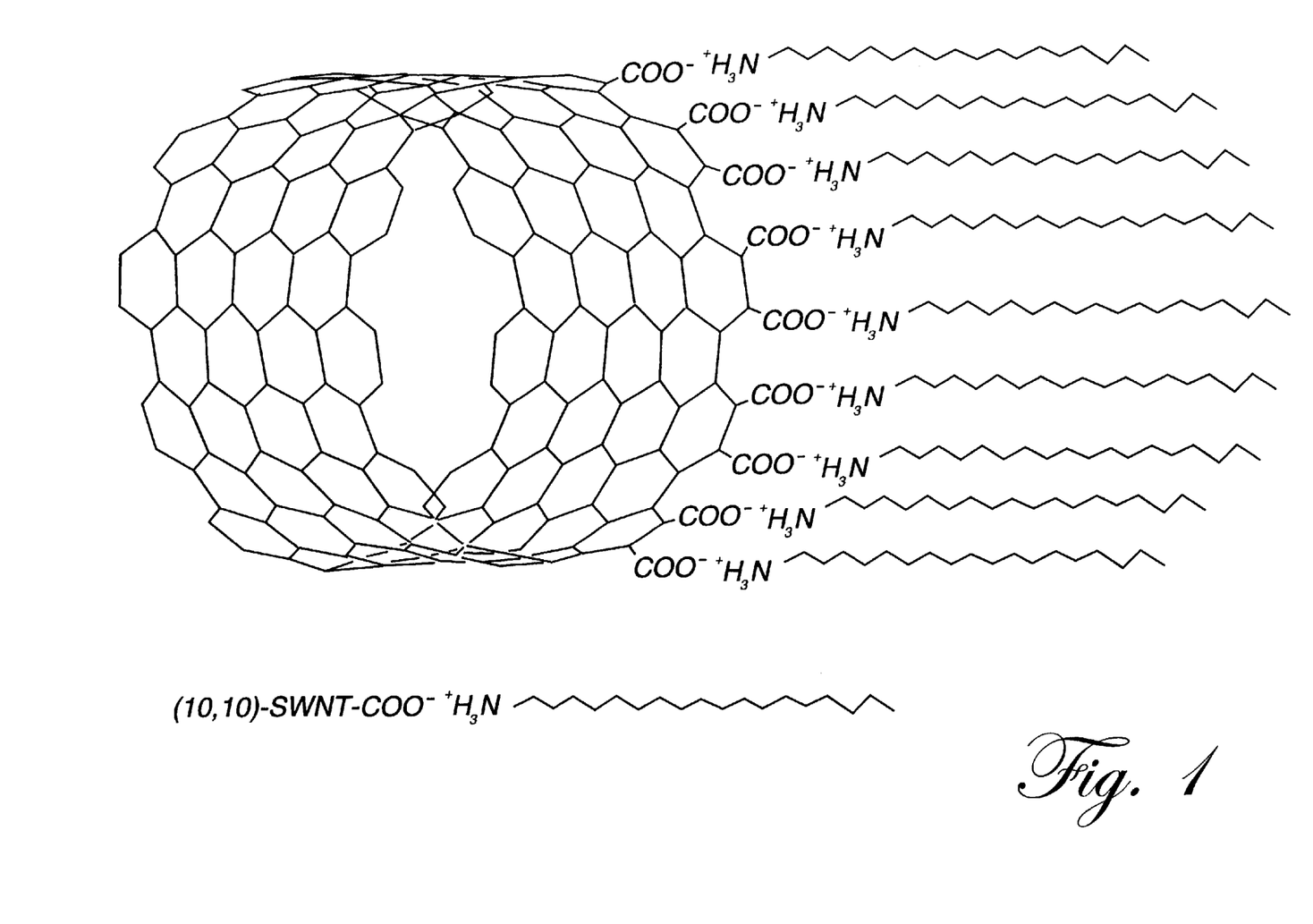
FIG. 1 schematically illustrates the structure of the end of the SWNT following functionalization with octadecylamine.

In the most preferred embodiment of this procedure, the AP-SWNTs are (1) Purified, (2) Shortened, (3) Polished, (4) Reacted directly with an amine or alkylaryl amine during which the bundles are exfoliated into a mixture of individual SWNTs and small bundles of SWNTs. This latter material is soluble in a number of organic solvents and is thus suitable for further chemical reactions. The chemical reactions used to effect this transformation of the carboxylic acid functionalized SWNTs are shown below. The structure of the end of an SWNT after functionalization with octadecylamine is shown in FIG. 1.

Purification is a desired step because the AP-SWNTs contain extraneous material, beside the approximately 40–60% SWNTs by volume. In particular the AP-SWNTs contain metal catalyst (nickel and yttrium), nanoparticles (carbonaceous particles sometimes containing metals), graphite, amorphous carbon, fullerenes and other contaminants.

A first purification procedure is a variation of a previously published method [Liu, J.; Rinzler, A. G.; Dai, H.; Hafner, J. H.; Bradley, R. K.; Boul, P. J.; Lu, A.; Iverson, T.; Shelimov, K.; Huffman, C. B.; Rodriguez-Macias, F.: Shon, Y.-S.; Lee, T. R.; Colbert, D. T.; Smalley, R. E., Fullerenes Pipes. Science 1998, 280, 1253–1255] [Rinzler, A. G.; Liu, J.; Dai, H.; Nilolaev, P.; Huffman, C. B.; Rodriguez-Macias, F. J.; Boul, P. J.; Lu, A. H.; Heymann, D.; Colbert, D. T.; Lee, R. S.; Fischer, J. E.; Rao, A. M.; Eklund, P. C.; Smalley, R. E., Large-Scale Purification of Single-Wall Carbon Nanotubes: Process, Product and Characterization. Appl. Phys. A 1998, 67, 29–37].

AP-SWNTs (40–60 vol. % of SWNTs) are refluxed in 2–3M nitric acid for about 48 hours (200–300 ml 2–3M nitric acid per gram of AP-SWNTs). After centrifugation, the supernatant solution is decanted. The pH of the solid is adjusted to about 7 by monitoring the pH of the supernatant liquid through repeated cycles of washing, centrifugation and decantation.

The resulting solid is suspended in an 0.5% aqueous solution of sodium dodecyl sulfate (SDS) by sonication for 2–4 hours (200–400 ml surfactant solution per gram of AP-SWNTs); the solution pH is then adjusted to 9–10 by addition of sodium hydroxide. Filtration through a cotton plug gives a black-colored suspension.

The resulting suspension is subjected to cross-flow filtration (CFF). The CFF cartridge has the following specifications: fiber diameter of 0.6 mm, pore size of 200 nm and surface area of 0.56 m$^2$. The buffer solution is made up to contain 0.5% SDS at a pH of 9–10 (adjusted by addition of NaOH). Initially the filtrate is black. The CFF is halted when the filtrate has become light brown. HCl is added to the resulting suspension to terminate the open ends of the SWNTs with carboxylic acid groups (~COOH $v_{C=O}$=1719 cm$^{-1}$) rather than carboxylate groups (~COO$^-$, $v_{C=O}$=1620 cm$^{-1}$).

After centrifugation, the black solid is washed with distilled water and ethyl alcohol and dried at room temperature. The purity of the resulting SWNTs is around 90 vol. %, and the yield is 10–30% (based on AP-SWNTs). A specific example of this purification procedure is found below in Example 1.

EXAMPLE 1

AP-SWNTs (6.3 g) were refluxed in 700 mL of 2 M HNO$_3$ for 48 hrs (oil bath at 130° C.). The mixture was centrifuged at 2000 rpm for 30 min. The acid layer was discarded and the solid was washed with water and then mixed into a 0.5% wt. solution of SDS in water (1500 mL). NaOH was added to the solution until the pH was above 10. The mixture was sonicated for 10 hrs. The suspension was acidified with HCl so that the acid form of the SWNTs precipitated and then it was centrifuged at 2000 rpm for 30 min. The water layer was decanted and passed through a membrane filter, pore size 1.2 μm. The solid slurry was then subjected to membrane filtration. Yield: 2.35 g.

A second or alternative purification procedure is also a variation of a previously published method [Ebbesen, T. W.; Dujardin, E.; Krishnan, A.; Treacy, M. M. J., Purification of Single-Shell Nanotubes. Adv. Mater. 1998, 10, 611–613]. It is simpler, but less complete than the first purification procedure.

AP-SWNTs (40–60 vol. % of SWNTs) are refluxed in 70% nitric acid until the emission of dense brown vapors ceases (for 4 g AP-SWNTs, this usually takes 10–12 hours). After centrifugation, the brown-colored supernatant solution is decanted. The pH of the solid is adjusted to about 7 by monitoring the pH of the supernatant liquid through repeated cycles of washing, centrifugation and decantation.

The resulting solid is washed with ethyl alcohol and dried at room temperature under reduced pressure. The purity of the SWNTs is around 70–80 vol. %, and the yield is 40–50%.

The next step is the shortening of the SWNTs. This aids in their dissolution in organic solvents.

A first shortening technique is a variation of a previously published method. [Liu, J.; Rinzler, A. G.; Dai, H.; Hafner, J. H.; Bradley, R. K.; Boul, P. J.; Lu, A.; Iverson, T.; Shelimov, K.; Huffinan, C. B.; Rodriguez-Macias, F.; Shon, Y.-S.; Lee, T. R.; Colbert, D. T.; Smalley, R. E., Fullerenes Pipes. Science 1998, 280, 1253–1255] [Rinzler, A. G.; Liu, J.; Dai, H.; Nilolaev, P.; Huffman, C. B.; Rodriguez-Macias, F. J.; Boul, P. J.; Lu, A. H.; Heymann, D.; Colbert, D. T.; Lee, R. S.; Fischer, J. E.; Rao, A. M.; Eklund, P. C.; Smalley, R. E., Large-Scale Purification of Single-Wall Carbon Nanotubes: Process, Product and Characterization. Appl. Phys. A 1998, 67, 29–37.] After this process the SWNTs are reduced to lengths in the range 100–300 nm.

The purified SWNTs (70–80%) are sonicated in a 1:2–3 mixture of 70% nitric acid and 90% sulfuric acid for 24–48 hours (500–100 ml acids per gram of purified SWNTs). The temperature is controlled to be lower than 60° C.

The resulting mixture is diluted 3–4 times by pouring into distilled water and cooled to room temperature. The solid is isolated by membrane filtration (100–200 nm pore size), washed with a minimum amount of distilled water, and dried at room temperature under reduced pressure to give shortened SWNTs (40–60% yield based on purified SWNTs). A specific example of this shortening technique is found below in Example 2.

EXAMPLE 2

0.387 g of purified SWNTs were sonicated in 40 mL of 3:1 H$_2$SO4 (concentrated) to HNO3 (concentrated) for 24 hours. Distilled water (200 mL) was added to the mixture, and it was filtered (membrane pore sizes 0.2 $\mu$m), washed with water and dried. Purified, shortened SWNTs: 0.273 g.

In accordance with a second, alternative approach, the purified SWNTs are stirred in a 3:1 mixture of 98% sulfuric acid and 70% nitric acid at 60–80° C. for 10–30 minutes (100 ml acid per gram of purified SWNTs). The resulting mixture is diluted 3–4 times by pouring into distilled water. After membrane filtration (200 nm pore size), the black solid is washed with distilled water, and dried at room temperature under reduced pressure.

The black solid is probe-sonicated in 5–15% ammonium persulfate aqueous solution for 6–12 hours (60–120 g ammonium persulfate per gram of purified SWNTs). After membrane filtration (200 nm pore size), washing with distilled water and ethyl alcohol, drying at room temperature under reduced pressure, the shortened SWNTs are obtained. 30–50% yield based on purified SWNTs.

The Raman spectrum of the shortened SWNTs ($\omega_r$=161, $\omega_t$=1595 cm$^{-1}$, $\omega_r$ and $\omega_t$ represent the Raman-active radial mode and tangential mode frequencies of SWNTs) is close to that of raw soot ($\omega_r$=162, $\omega'_t$=1592 cm$^{-1}$). Because the Raman radial mode of the SWNTs is sensitive to the diameter, but not to the symmetry of the nanotube, based on $\omega_r$(cm$^{-1}$)=223.75 (cm$^{-1}$ nm)/d(nm), the average diameter of the shortened SWNTs in a typical sample is estimated to be 1.38 nm.

Next is the polishing of the SWNTs. It is hypothesized that the polishing step removes polar hydroxylic functionality from the processed SWNTs. These hydroxylic species may be physically or chemically attached to the purified, shortened SWNTs. At the end of this treatment the SWNTs are less hydrophilic (less susceptible to forming aqueous dispersions).

Specifically, the purified shortened SWNTs are stirred in a 4:1 mixture of 90% sulfuric acid and 30% hydrogen peroxide at 60–80° C. for 20–35 minutes (300–500 ml of liquid per gram of purified, shortened SWNTs).

The resulting mixture is diluted 3–4 times by pouring into distilled water and cooled to room temperature. After membrane filtration (100–200 nm pore size), washing with distilled water and ethyl alcohol, and drying at room temperature under reduced pressure, the polished shortened SWNTs are obtained (40–50% yield based on purified, shortened SWNTs).

A specific example of this shortening technique is found below in Example 3.

EXAMPLE 3

0.42 g of purified, shortened SWNTs were heated at 70° C. in 50 mL of 4:1 H$_2$SO$_4$(90%) to H$_2$O$_2$(30%) for 15 minutes. Water (300 mL) was added to the mixture, and it was filtered (membrane pore size 0.2 $\mu$m), washed with water and dried. Mass: 0.6 g.

The next step in the method of solubilizing is to directly react the carboxylic acid groups on the open ends of the shortened SWNTs with an amine or an alkylaryl amine having the formula RNH$_2$ or R$_1$R$_2$NH wherein R, R$_1$ and R$_2$=CH$_3$(CH$_2$)$_n$, where n=9–50 or R, R$_1$ and R$_2$=(C$_6$H$_4$)(CH$_2$)$_n$CH$_3$ where n=5–50 via the formation of a zwitterion. This is done with simple acid-base chemistry by mixing the shortened SWNTs with an appropriate quantity of amine or alkylaryl amine having the formulae just described either without any solvent or in an appropriate aromatic solvent such as toluene. Amines that may be utilized include, but are not limited to, nonylamine, dodecylamine octadecylamine, pentacosylamine, tetracontylamine, pentacontylamine and any mixtures thereof. Alkylaryl amines that may be utilized include 4-pentylaniline, 4-dodecylaniline, 4-tetradecylaniline, 4-pentacosylaniline, 4-tetracontylaniline, 4-pentacontylaniline and any mixtures thereof. Long alkyl chains of at least 5 and more preferably 9 carbon atoms and up to 50 carbon atoms are required to increase the solubility of the resulting shortened SWNTs product. The mixture is heated to substantially 50°–200° C. and more preferably 90–100° C. for approximately 96 hours. This procedure advantageously results in relatively high-yields (approximately 70–90%) of soluble shortened SWNTs. During the processing, the volume of the shortened SWNTs expands over time. It is hypothesized that this is due to exfoliation of the SWNTs bundles to give individual nanotubes.

In sharp contrast to unprocessed shortened SWNTs of the prior art which are insoluble in organic solvents, the processed shortened SWNTs of the present invention include long alkyl chains that provide substantial solubility in tetrahydrofuran, chloroform and aromatic solvents such as benzene, toluene, chlorobenzene, 1,2 dichlorobenzene and ether. The black-colored or unsaturated solution of s-SWNTs is visually non scattering, and no precipitation is observed upon prolonged standing. Like fullerenes, the s-SWNTs are insoluble in water, ethanol and acetone. The IR spectrum of soluble s-SWNTs indicates the formation of the amide bond: $v_{C=O}$=1663 cm$^{-1}$ and 1642 cm$^{-1}$.

The following examples are presented to further illustrate the invention, but it is not to be considered as limited thereto.

EXAMPLE 4

Preparation of s-SWNT-COO$^-$, $^+$NH$_3$(CH$_2$)$_{17}$CH$_3$ 0.22 grams of shortened SWNTs were heated in excess octadecylamine (0.5 g) for four days. After cooling to room temperature, the excess amine was removed by washing with EtOH 4 times (5–10 minutes sonication). The remaining solid was dissolved in THF, and filtered. The black-colored solution was taken to dryness at room temperature on a rotary evaporator to give 0.14 g of solid product.

Figure 2:
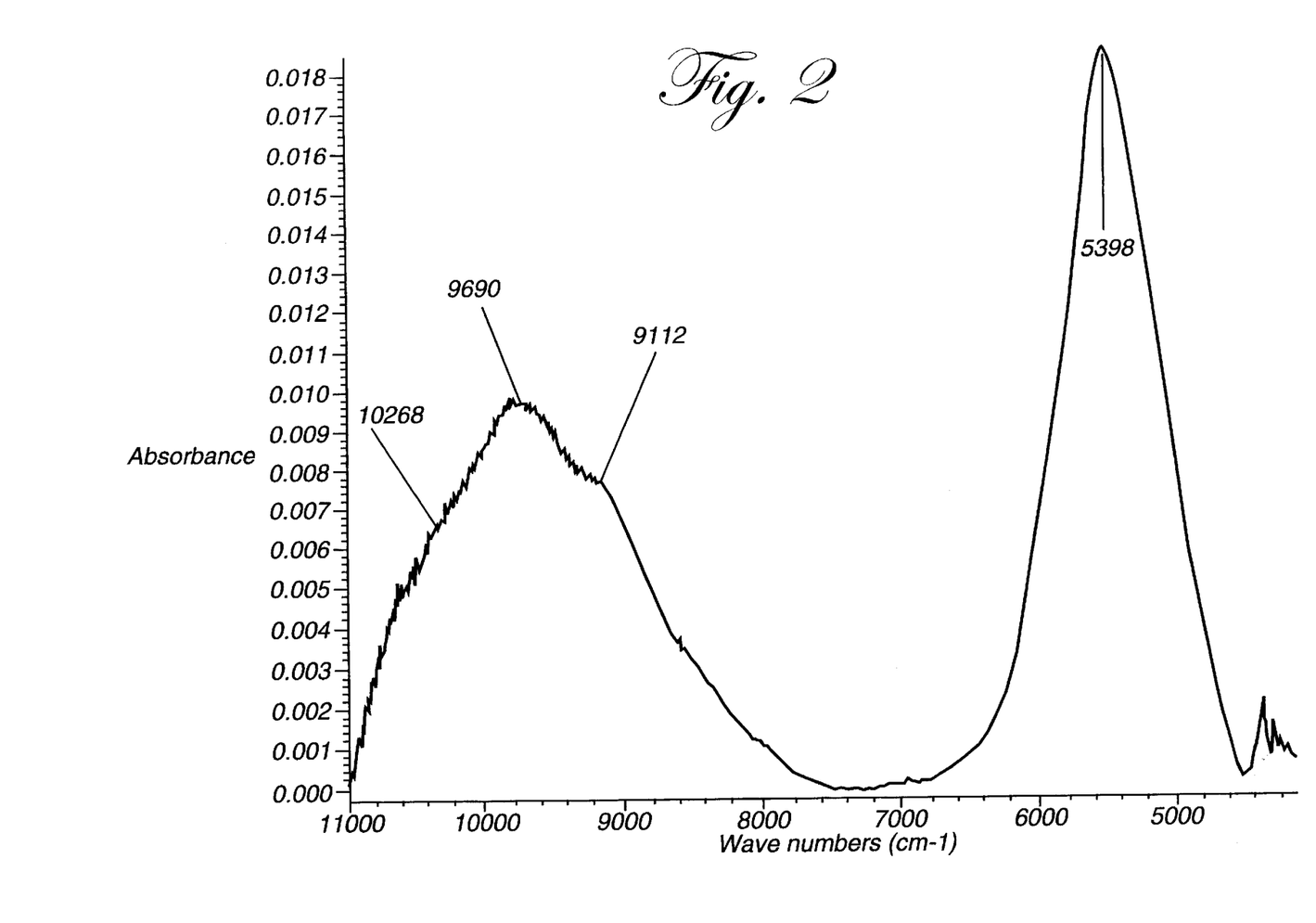
FIG. 2 is the Near-IR spectrum of s-SWNT-COO$^{-+}$NH$_3$(CH$_2$)$_{17}$CH$_3$ (quartz cell, light path 1 mm, Nicolet Magna-IR 560 ESP spectrometer).

Thus, we completed a simple acid-base reaction and produced a zwitterion. The resulting SWNTs were soluble in tetrahydrofuran. The near-IR of the s-SWNTs produced in this method (FIG. 2) show peaks at 10268, 9690, and 9112 cm$^{-1}$ (1.27, 1.20 and 1.13 eV) for the metallic band transitions, and a peak at 5389 cm$^{-1}$ (0.67 eV) for the semi-conducting band transitions. The amine is associated with the SWNT via an ionic bond and this is reflected in the mid-IR, which shows a peak at 1579 cm$^{-1}$ due to the carboxylate anion stretch mode. The NMR of the sample is very broad, with peaks at $\delta$0.87 (CH$_3$), 1.21 (CH$_2$), and 3.49 ($\alpha$-CH$_2$). The s-SwNT-COO$^-$, $^+$NH$_3$(CH$_2$)$_{17}$CH$_3$ were found to be soluble in THF but not soluble in CH$_2$Cl$_2$ and CS$_2$. This may be due to the hydrogen bonding that can occur between THF and the primary ammonium salt.

EXAMPLES 5–15

The procedures of Example 4 are completed except that nonylamine, dodecylamine, pentacosylamine, tetracontylamine, pentacontylamine, 4-pentylaniline, 4-dodecylaniline, 4-tetradecylaniline, 4-pentacosylaniline, 4-tetracontylaniline or 4-pentacontylaniline is substituted for octadecylamine.

EXAMPLE 16

A mixture of polished, shortened SWNTs and excess long-chain amine was heated at 70–140° C. for 72–240 hours. The excess long-chain amine was removed by repeated washing with ethyl alcohol. The remaining solid was dissolved in tetrahydroJuran, and after filtration, the black-colored filtrate was concentrated on a rotary evaporator. Ethyl alcohol was added to the resulting concentrated solution to precipitate the SWNTs. After membrane filtration, the black solid was washed with ethyl alcohol and dried at room temperature under reduced pressure (70–90% yield based on polished, shortened SWNTs).

EXAMPLE 17

A mixture of shortened SWNTs and excess long-chain amine was heated at 70–140° C. for 72–240 hours. The excess long-chain amine was removed by repeated washing with ethyl alcohol. The remaining solid was dissolved in tetrahydrofuran, and after filtration, the black-colored filtrate was concentrated on a rotary evaporator. Ethyl alcohol was added to the resulting concentrated solution to precipitate the SWNTs. After membrane filtration, the black solid was washed with ethyl alcohol and dried at room temperate under reduced pressure (70–90% yield, based on polished, shortened SWNTs).

EXAMPLE 18

A mixture of polished, shortened SWNTs and excess long-chain amine was heated at 70–140° C. for 72–240 hours. The excess long-chain amine was removed by repeated washing with ethyl alcohol. The remaining solid was dissolved in tetrahydrofuran, and after filtration, the black-colored filtrate was concentrated on a rotary evaporator. Ethyl alcohol was added to the resulting concentrated solution to precipitate the SWNTs. After membrane filtration, the black solid was washed with ethyl alcohol and dried at room temperature under reduced pressure (70–90% yield, based on polished shortened SWNTs).

EXAMPLE 19

A mixture of shortened SWNTs and excess long-chain amine was heated at 70–140° C. for 72–240 hours. The excess long-chain amine was removed by repeated washing with ethyl alcohol. The remaining solid was dissolved in tetrahydrofuran, and after filtration, the black-colored filtrate was concentrated on a rotary evaporator. Ethyl alcohol was added to the resulting concentrated solution to precipitate the SWNTs. After membrane filtration, the black solid was washed with ethyl alcohol and dried at room temperature under reduced pressure (40–70% yield, based on polished, shortened SWNTs).

In summary, the method of the present invention includes the preparation of solutions of naked carbon metals and semiconductors in organic solutions including both ionic (charge transfer) and covalent solution phase chemistry with concomitant modulation of the SWNT band structure. It is now possible to obtain well-characterized, highly purified SWNT materials which are suitable for physical property measurements. The s-SWNTs will have a rich chemistry at their ends, the exterior walls and the interior cavity. s-SWNTs are versatile precursors to copolymer materials with distinctive mechanical and electrical properties and as new ligands for metal complexation.

The foregoing description of a preferred embodiment of the invention has been presented for purposes of illustration and description. It is not intended to be exhaustive or to limit the invention to the precise form disclosed. Obvious modifications or variations are possible in light of the above teachings. For example, while the preferred embodiment teaches that the SWNTs are to be purified, shortened and polished in accordance with the procedure for these steps set out above to increase the purity and yield of the desired final product, the purifying, shortening and polishing steps are merely preferred and not mandatory. In fact, raw SWNTs may be processed in accordance with the present invention. The embodiment was chosen and described to provide the best illustration of the principles of the invention and its practical application to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally and equitably entitled.

What is claimed is:

1. A method of solubilizing single-walled carbon nanotubes in an organic solvent, comprising:
   purifying said single-walled carbon nanotubes;
   terminating purified single-walled carbon nanotubes with carboxylic acid groups;
   shortening the single-walled carbon nanotubes terminated with carboxylic acid groups;
   polishing the resulting single-walled carbon nanotubes;
   reacting said carboxylic acid groups on said open ends of said single-walled carbon nanotubes directly with an amine or alkylaryl amine having a formula (1) RNH$_2$, or (2) $R_1R_2NH$ wherein R, $R_1$ and $R_2=CH_3(CH_2)_n$ where n=9–50 or R, $R_1$ and $R_2=C_6H_4(CH_2)_nCH_3$ where n=5–50; and dissolving said reacted single-walled carbon nanotubes in said organic solvent.

2. The method of claim 1, wherein said amine is a compound selected from a group consisting of nonylamine, dodecylamine octadecylamine, pentacosylamine, tetracontylamine, pentacontylamine and any mixtures thereof.

3. The method of claim 1, wherein said alkylaryl amine is a compound selected from a group consisting of 4-pentylaniline, 4-dodecylaniline, 4-tetradecylaniline, 4-pentacosylaniline, 4-tetracontylaniline, 4-pentacontylaniline and any mixtures thereof.

4. The method of claim 1, further including mixing said reacted single-walled carbon nanotubes with said amine or alkylaryl amine without or in a solvent and heating a resulting mixture to 50°–200° C.

5. The method of claim 4, wherein said solvent is selected from a group consisting of toluene, chlorobenzene, dichlorobenzene, dimethylformamide, hexmethylphosphoramide, dimethylsulfoxide and any mixtures thereof.

6. The method of claim 4, further including continuing said heating for at least 96 hours.

7. The method of claim 1, further including mixing said reacted single-walled carbon nanotubes with said amine or alkylaryl amine without or in a solvent and heating a resulting mixture to 90°–100° C.

8. The method of claim 7, wherein said solvent is toluene.

9. The method of claim 7, further including continuing said heating for at least 96 hours.

10. The method of claim 1, wherein said terminating is completed by adding a mineral acid to an aqueous suspension of said purified carbon nanotubes.

11. The method of claim 1, wherein said organic solvent is selected from a group consisting of tetrahydrofuran, chloroform, dichloromethane, benzene, toluene, chlorobenzene, 1,2-dichlorobenzene, dichlorocarbene, ether and mixtures thereof.

12. The method of claim 1, wherein said single-walled carbon nanotubes have a length between 1–100 nm and a diameter between 0.5–100 nm.

13. A method of solubilizing single-walled carbon nanotubes in an organic solvent, comprising:

terminating said single-walled carbon nanotubes with carboxylic acid groups;

reacting said carboxylic acid groups of said single-walled carbon nanotubes directly with an amine or alkylaryl amine having a formula (1) $RNH_2$ or (2) $R_1R_2NH$ wherein R, $R_1$ and $R_2=CH_3(CH_2)_n$ where n=9–50 or R, $R_1$ and $R_2=(C_6H_4)(CH_2)_nCH_3$ where n=5–50; and dissolving said reacted single-walled carbon nanotubes in said organic solvent.

14. A solution comprising:

single-walled carbon nanotubes terminated with carboxylic acid groups reacted with an amine or alkylaryl amine having an uninterrupted carbon chain of at least 5 carbons in length dissolved in an organic solvent.

15. The solution set forth in claim 14, wherein said organic solvent is aromatic, or an ether or a chlorocarbon.

* * * * *

UNITED STATES PATENT AND TRADEMARK OFFICE
CERTIFICATE OF CORRECTION

PATENT NO.    : 6,187,823 B1
DATED         : February 13, 2001
INVENTOR(S)   : Haddon et al.

It is certified that error appears in the above-identified patent and that said Letters Patent is hereby corrected as shown below:

Column 3,
Line 44, please replace the chemical formula with

Column 6,
Line 64, after the word "the" please delete "amide bond: $\upsilon_{c=o} = 1663$ cm$^{-1}$" and replace with -- zwitterion: $\upsilon_{c=o} = 1614$ cm$^{-1}$ --.

Column 10,
Line 10, after the word "between" please delete "1-100 mm" and replace with -- 1-1000 nm --.

Signed and Sealed this

Twenty-seventh Day of August, 2002

Attest:

JAMES E. ROGAN
Attesting Officer          Director of the United States Patent and Trademark Office

UNITED STATES PATENT AND TRADEMARK OFFICE
CERTIFICATE OF CORRECTION

PATENT NO.   : 6,187,823 B1                                           Page 1 of 1
DATED        : February 13, 2001
INVENTOR(S)  : Haddon et al.

It is certified that error appears in the above-identified patent and that said Letters Patent is hereby corrected as shown below:

<u>Column 1,</u>
Line 7, insert the following:

-- The invention was made with Government support under NSF-EPSCOR grant EPS-9452895. The Government may have certain rights in this invention. --

Signed and Sealed this

Thirteenth Day of May, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,187,823 B1
DATED : November 4, 2003
INVENTOR(S) : Robert C. Haddon et al.

It is certified that error appears in the above-identified patent and that said Letters Patent is hereby corrected as shown below:

Column 11,
Line 40, replace "$R_2 = - (C_6H_1)(CH_2)_nCH_3$" with -- $R_2 = - (C_6H_4)(CH_2)_nCH_3$ --.

Signed and Sealed this

Eleventh Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,187,823 B1
DATED : February 13, 2001
INVENTOR(S) : Robert C. Haddon et al.

It is certified that error appears in the above-identified patent and that said Letters Patent is hereby corrected as shown below:

This certificate supersedes Certificate of Correction issued May 11, 2004, the number was erroneously mentioned and should be vacated since no Certificate of Correction was granted.

Signed and Sealed this

Twentieth Day of December, 2005

JON W. DUDAS
*Director of the United States Patent and Trademark Office*